United States Patent
Schlegl et al.

(10) Patent No.: US 12,407,798 B2
(45) Date of Patent: Sep. 2, 2025

(54) METHOD OF OPERATING AT LEAST TWO LASER DEVICES AND DISPLAY DEVICE

(71) Applicant: ams-OSRAM International GmbH, Regensburg (DE)

(72) Inventors: Sebastian Schlegl, Abbach (DE); Joerg Erich Sorg, Regensburg (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 23 days.

(21) Appl. No.: 18/570,112

(22) PCT Filed: Jun. 15, 2022

(86) PCT No.: PCT/EP2022/066438
§ 371 (c)(1),
(2) Date: Dec. 14, 2023

(87) PCT Pub. No.: WO2022/263582
PCT Pub. Date: Dec. 22, 2022

(65) Prior Publication Data
US 2024/0283898 A1    Aug. 22, 2024

(30) Foreign Application Priority Data
Jun. 18, 2021 (DE) ..................... 10 2021 115 811.7

(51) Int. Cl.
H04N 9/31 (2006.01)

(52) U.S. Cl.
CPC ......... *H04N 9/3161* (2013.01); *H04N 9/3135* (2013.01); *H04N 9/3164* (2013.01); *H04N 9/3182* (2013.01); *H04N 9/3194* (2013.01)

(58) Field of Classification Search
CPC .. H04N 9/3135; H04N 9/3161; H04N 9/3164; H04N 9/3182; H04N 9/3194;
(Continued)

(56) References Cited

U.S. PATENT DOCUMENTS

| | | |
|---|---|---|
| 2009/0028199 A1 | 1/2009 | Brown et al. |
| 2010/0176740 A1 | 7/2010 | Hying et al. |
| (Continued) | | |

FOREIGN PATENT DOCUMENTS

| | | |
|---|---|---|
| DE | 102012222292 A1 | 6/2014 |
| EP | 2160926 A1 | 3/2010 |
| WO | 2006094590 A1 | 9/2006 |

OTHER PUBLICATIONS

International Search report issued for the corresponding patent application No. PCT/EP2022/066438, dated Oct. 3, 2022, 5 pages (for informational purposes only).

(Continued)

*Primary Examiner* — Sherrie Hsia
(74) *Attorney, Agent, or Firm* — VIERING, JENTSCHURA & PARTNER mbB

(57) ABSTRACT

A method is described for operating at least two laser devices for generating a display, in which the at least two laser devices generate a sequence of light points. In a first step, a first one of the sequence of light spots is generated during a first period of time by at least one of the at least two laser devices and a voltage drop across the at least one of the at least two laser devices is detected within the first period of time. A target brightness is then determined for a second of the sequence of light points for at least one of the at least two laser devices. Subsequently, a supply current and/or a turn-on time is determined during a second time period for generating the target brightness for the at least one of the at least two laser devices.

17 Claims, 5 Drawing Sheets

(58) Field of Classification Search
CPC ...... H04N 9/31; H04N 9/312; H01S 5/06808; H01S 3/0014
USPC ........ 348/744, 750, 799, 801–803, 807, 808
See application file for complete search history.

(56) References Cited

U.S. PATENT DOCUMENTS

| | | |
|---|---|---|
| 2014/0153599 A1 | 6/2014 | Delfs et al. |
| 2019/0157839 A1 | 5/2019 | Gudaitis et al. |
| 2021/0215319 A1* | 7/2021 | Raring .................. H01S 5/0225 |

OTHER PUBLICATIONS

Search report issued for the corresponding German patent application No. 10 2021 115 811.7, dated Mar. 4, 2022, 7 pages (for informational purposes only).

* cited by examiner

METHOD OF OPERATING AT LEAST TWO LASER DEVICES AND DISPLAY DEVICE

CROSS-REFERENCE TO RELATED APPLICATIONS

The present application is a U.S. National Stage Application of International Application PCT/EP2022/066438, filed Jun. 15, 2022, and claims the priority of German patent application DE 10 2021 115 811.7 of Jun. 18, 2021; the entire disclosures of the above-listed applications are hereby explicitly incorporated by reference.

FIELD

The present disclosure relates to a method for operating at least two laser devices, in particular for generating a display, in which the at least two laser devices generate a sequence of light points, in particular of different brightness. The present disclosure also relates to a display device.

BACKGROUND

In special applications, lasers of different colors are used to generate a white light or a white point of light. Among other things, such laser systems are used in beam scanning to bring points of light onto a display in rapid succession. This type of process is used in the automotive sector as well as in augmented reality, virtual reality and data glasses in general. In this type of beam scanning, emitted light from red, green and blue lasers is combined additively to form colored light in order to be able to display the widest possible color space and also white light.

Reliable and predictable control of semiconductor lasers is an indispensable prerequisite for some applications. One difficulty in this context is the fact that the generation of white light requires precise knowledge of the behavior of the respective laser device. For additive color mixing, it is essential to be able to approach specific operating points on the characteristic curve of the respective laser. This presupposes that the characteristic curves of the lasers are either very stable or easily predictable.

The characteristic curve of a laser is subject to many influencing factors, one of which is temperature. This can be dynamic, so that the behavior and therefore also the color of the laser changes. Accordingly, there is a need to specify a method for operating one or more lasers in which the desired color location can be better adjusted.

SUMMARY

These and other objects are solved by the subject matter of the independent claims. Further developments and embodiments are the subject of the dependent claims.

The inventors have recognized that the temperature as a significant influencing factor is mainly determined by the ambient temperature and self-heating. The former, i.e. the ambient temperature, can be determined with high precision by temperature sensors and, due to the low rate of change, can be easily determined and subsequently compensated for. In contrast, the influence of self-heating is determined by the currently projected information content and is therefore very dynamic. Measuring the current temperature of the laser device is therefore difficult or even impossible.

The inventors now propose a method for taking into account the current operating temperature of the laser devices. This variable or a measured variable associated with the temperature can be used to draw conclusions about the behavior of the laser devices at a later point in time. In particular, if the desired brightness or the desired color is known as (target brightness and target color) at the later point in time, the current required for this can be determined on the basis of the target brightness or target color and the measured variable.

In particular, it is proposed to use the current-voltage characteristics of the laser devices. The characteristic curves are characteristic for different temperatures, so that if the characteristic curve is known, a certain brightness or color location can be reliably displayed by the corresponding control of the laser device. Conversely, a measurement of a current-voltage value pair (which follows the dynamics of the laser very quickly and thus correlates with the content of a displayed image) can be used to infer the temperature and or even directly the characteristic curve to be used.

One aspect thus relates to a display device. This is understood to mean a device that makes a number of defined pixels visible to a viewer. In some aspects, this can be a display screen whose pixels are illuminated by the laser device or devices. Alternatively, a point of impact of the laser beams can also define such pixels. In this way, a display device also relates to devices that project light directly onto a retina of a viewer. The display device according to the proposed principle comprises a memory in which values for target color locations and/or target brightnesses are stored for a plurality of illuminable pixels of the display device. To simplify matters, target brightnesses and target color coordinates are referred to below.

The device also contains a first and at least one second laser device, which are designed to generate laser light for illuminating the pixels in a pulsed mode while supplying a supply current. In addition, a detector circuit is provided, which is coupled to at least one of the first and at least one second laser device, as well as a supply circuit for providing an adjustable supply current to the first and at least one second laser device. A control circuit is now coupled to the detector circuit and the supply circuit. The control circuit is designed to detect a voltage drop across the coupled laser device during a first period of time by means of the detector circuit and to set a supply current for at least one of the first and at least one second laser device during a second period of time based on the color location and/or the target brightness for an image point to be illuminated and the detected voltage drop.

For this purpose, a voltage drop is detected during a period in which the first of the at least two laser devices is switched to a reverse direction. In other words, the first of the at least two laser devices is operated with a reverse voltage during the measurement.

In this way, the target value is not only simply set using a characteristic curve or the supply current determined from the characteristic curve, but the voltage drop when illuminating a previous pixel is also taken into account.

This takes advantage of the fact that the voltage drop is temperature-dependent and the temperature of the device in turn influences the brightness or the color location of a new pixel to be illuminated.

The voltage drop during which the first of the at least two laser devices is subjected to a reverse voltage results in several advantages. Firstly, no light is emitted during this period. Secondly, applications that use diffractive light guides tend to develop optical artifacts in imaging (Newton ring). These artifacts are caused by constructive and destructive interference when coherent laser radiation with a small spectral width interacts with periodic optical structures. One way of suppressing these effects is to broaden the spectral emission of the laser devices used. This is possible if lasers are only pulsed for a very short time and the charge carrier levels in the laser are at least partially emptied simultaneously before switching on. The level is emptied by switching in the reverse direction. In this case, immediately after the laser is switched on, there is a short time interval in which the laser does not run stably, which in turn results in a broadening of the spectral emission and thus produces the desired effect.

Several aspects can be summarized under the term voltage drop. Firstly, the term means a potential difference between two points either at a point in time or averaged over a certain period of time. A voltage drop across the laser device in this case would therefore be the voltage measured between the terminals of the laser device at a point in time. However, for the purposes of this application, the term voltage drop is to be understood not only as a single measurement, but also as a sequence of measurements representing a voltage curve over a longer period of time. In such a case, the voltage drop forms a voltage curve over the device. This can be essentially constant, but can also fluctuate due to temperature or heating effects during the current flow through the device. In all cases, the measured value can be used to make a prediction for the future and, in particular, to set a future supply current or a future switch-on time or a combination of these.

In some embodiments, the control circuit is configured to adjust the supply current in which the control circuit adjusts a magnitude of the supply current or the duration for which the at least one laser device is operated during the second time period accordingly. Thus, the desired target value of the color location or brightness for the pixel to be illuminated is set by the supply current, the duty cycle or a combination thereof, taking into account the temperature of the laser device. Since a change in temperature can be quickly detected by the associated voltage drop, it would even be possible in some embodiments to adjust the supply current or the duty cycle for the pixel currently being illuminated and not just for a subsequent pixel.

In a further aspect, the control circuit is further configured to detect, via the detector circuit, a voltage drop across the first of the at least two laser devices within or during a turn-on time within the first time period. Further possibilities are a measurement while the at least one of the at least two laser devices is operated below a laser threshold or the measurement of the voltage drop during the period in which the at least one of the two laser devices jumps back from the last of the sequence of light spots to the first of the sequence of light spots.

In some aspects, the display device comprises at least three laser devices for generating different colors, which can be superimposed in particular to form the color white. This can be used to create devices that are particularly suitable for augmented reality or projection applications.

In some embodiments, a plurality of temperature-dependent current and voltage value pairs are provided, which in particular form support values of a virtual temperature-dependent characteristic curve field and which are stored in a memory. these characteristic curve fields can now be used to determine the characteristic curve with which the laser device is currently being operated. This results from the measured voltage drop and the current flowing through the device. The temperature can be derived from the characteristic curve field determined in this way. In a subsequent step, the control circuit is designed to select the supply current or the duty cycle for the new pixel to be set for the target brightness and/or color location to be set, taking the temperature into account.

Accordingly, in some aspects it is provided that the control circuit determines a current and voltage value pair from the plurality of temperature-dependent current and voltage value pairs, in particular a current and voltage value pair that comes closest to the detected current drop and the detected voltage drop. The control circuit determines the supply current for generating the target brightness from a virtual characteristic curve associated with the determined pair of current and voltage values.

Another aspect relates to a method for operating at least two laser devices, in particular for generating a display. The at least two laser devices generate a sequence of light spots, in particular with different brightnesses. The method comprises the step of generating a first one of the sequence of light spots during a first period of time by a first one of the at least two laser devices. Within the first time period, a voltage drop is detected across the first of the at least two laser devices. This detection is carried out by measuring the voltage drop while a reverse voltage is applied to the first laser device. A target brightness is then determined for a second of the sequence of light points for at least one of the at least two laser devices at a later point in time. The target brightness is used to determine a supply current and/or a switch-on time during a second time period for generating the target brightness for the at least one of the at least two laser devices, taking into account the voltage drop detected within the first time period. At least one of the at least two laser devices is then controlled during the second time period with the determined supply current and/or the switch-on time.

With this approach, the current and thus the target brightness can also be set for future time periods via the recorded temperature. This makes use of the fact that the voltage drop is in turn a function of the temperature, i.e. a current-voltage characteristic is temperature-dependent. If a voltage drop at a set current is known, the characteristic curve can be determined from this. With the simplifying consideration that the temperature remains constant or with the knowledge of the target brightness, the current can be set appropriately for a given target brightness (essentially given by current*voltage).

Conversely, it is also possible to determine the temperature by detecting the voltage drop at a light point and using this information to adjust the target brightness for the future light point. This aspect is particularly useful if the control is to be carried out not only purely by hardware, but also by means of programmable circuits such as FPGA, ASIC or software.

In some aspects, the information recorded in this way is used to set the current or the switch-on time for the laser device for which the voltage drop was also recorded. However, it is also possible in the case of close thermal coupling of two or more laser devices to use this information to set the parameters of the other laser devices. In this respect, the multiple laser devices can also be designed to generate light of different colors. For example, an RGB laser device (i.e. red, green and blue) can be designed in such a way that only the voltage drop of one laser device, e.g. the central device, is recorded, but the current and/or switch-on time for all of them is changed accordingly for future time periods. In the case of at least three laser devices of different colors in the above-mentioned manner, these can be superimposed in particular to form the color white. In this way, white laser light can be generated, whereby the proposed method is particularly suitable for this purpose as it enables color location compensation.

The voltage drop, or information from which a temperature or a temperature curve can be derived, can be recorded in various ways. In some aspects, a voltage drop across the first of the at least two laser devices is measured within or during a turn-on time. In other words, the voltage drop is detected here during laser operation of the diode, i.e. in the forward direction. Alternatively, the voltage drop across the first of the at least two laser devices can also be measured during a period in which the first of the at least two laser devices is switched in a reverse direction. This possibility results from the characteristic curve, which also shows a temperature-dependent curve in the reverse direction.

In some aspects, the first of the at least two laser devices is operated below the laser threshold. Such operation allows a faster settling time, but the device still generates emitted but incoherent light. Even in such an operating state, the voltage drop across the first of the at least two laser devices can be detected and conclusions can be drawn about the temperature. Finally, in some aspects, a voltage drop across the first of the at least two laser devices can be measured during the period in which the at least one of the two laser devices jumps back from the last of the sequence of light spots to the first of the sequence of light spots.

In some aspects, the laser devices are operated with a PWM method so that they are switched on and off for a certain duration during a time period, also referred to as pulse duration. the ratio of on-time to off-time together with the current then results in the brightness. For this purpose, in some aspects it is provided to divide this first time period into a plurality of sub-time periods, wherein the first of the at least two laser devices is operated in pulsed mode during the sub-time periods. In other words, the total turn-on time during the first time period is divided into a plurality of smaller units such that the laser device itself is switched to the laser light emitting mode a plurality of times during the first time period. In some aspects, these durations may be in the range of a few ns.

In further aspects, tables, in particular look-up tables, are provided in which a plurality of temperature-dependent current and voltage value pairs are stored. In some aspects, these form support values of a virtual temperature-dependent characteristic curve field. This allows a characteristic curve field to be interpolated or otherwise generated. In one aspect, a current-voltage value pair is recorded and the distance to the next support value pair is determined. The virtual characteristic curve associated with this pair of values is then used to determine the required current at a specified target brightness.

In one aspect, the step of determining at least one of a supply current and a turn-on time thus comprises determining a pair of current and voltage values from the plurality of temperature-dependent pairs of current and voltage values, in particular a pair of current and voltage values that is closest to or in a predetermined relationship with the known current and the detected voltage drop. The current and voltage value pairs linked to the current and voltage value pair determined in this way are then determined and the supply current for generating the target brightness is interpolated from these.

In some further aspects, the step of determining at least one of a supply current and a turn-on time comprises calculating a supply current through the at least one of the at least two laser devices at a predetermined turn-on time; or calculating a turn-on time of the at least one of the at least two laser devices at a predetermined current. The calculation is performed as a function of a temperature based on the detected voltage drop and a current flowing through the at least one laser device. In this way, instead of look-up tables, the target brightness is defined as a function of the current in relation to a temperature.

At very high switching speeds in the range of a few nanoseconds, it can be useful not to determine or specify the target brightness of an individual light spot, but to carry out a certain averaging. Since the target brightnesses each have an influence on the temperature and this in turn on the characteristic curve of the laser device, the future temperature or temperature of future light points can be estimated by averaging the target brightnesses. In some aspects, the target brightness for a second of the sequence of light points is determined by determining an average brightness from the target brightnesses of the sequence of light points between the first and second light points of the sequence of light points. In addition, an expected temperature at the target brightness can be estimated, with the estimated expected temperature being used to determine at least one of a supply current and a switch-on time.

The method presented here can be used in particular in laser applications where high color accuracy is required. An example of this would be in data glasses in which laser beam scanning is carried out, whereby at least three laser devices generate a sequence of light points to produce laser light of different colors.

BRIEF DESCRIPTION OF THE DRAWINGS

Further aspects and embodiments according to the proposed principle will become apparent with reference to the various embodiments and examples described in detail in connection with the accompanying drawings.

DETAILED DESCRIPTION

The following embodiments and examples show various aspects and their combinations according to the proposed principle. The embodiments and examples are not always to scale. Likewise, various elements may be shown enlarged or reduced in size in order to emphasize individual aspects. It is understood that the individual aspects and features of the embodiments and examples shown in the figures can be readily combined with each other without affecting principles of the present disclosure. Some aspects have a regular structure or shape. It should be noted that slight deviations from the ideal shape may occur in practice without, however, contradicting the inventive concept.

Figure 1:
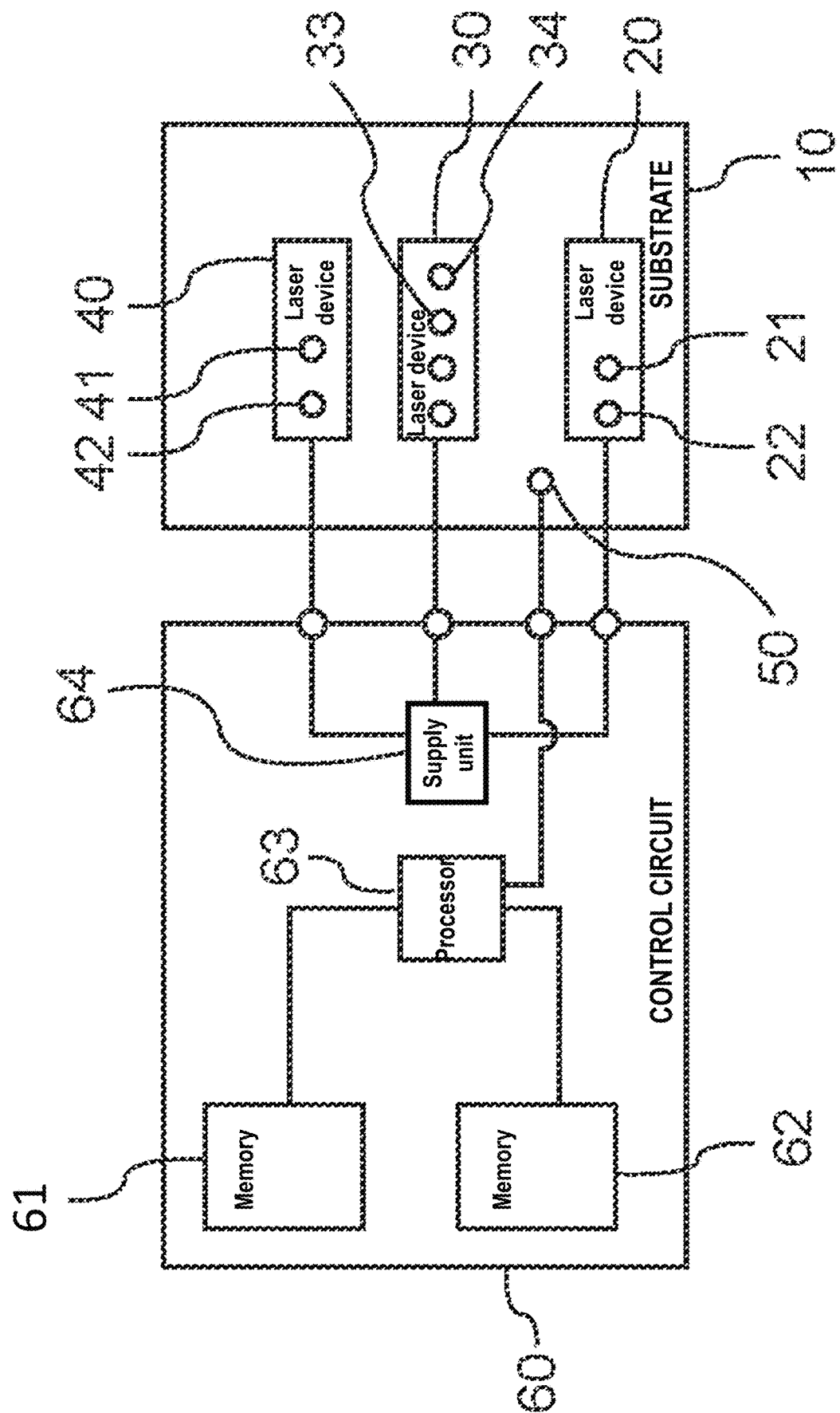
FIG. 1 shows a schematic representation of a display device according to at least one aspect of the present disclosure.

FIG. 1 shows an arrangement with several laser devices operating according to the proposed principle. The laser devices 20, 30 and 40 are arranged on a common substrate 10. The arrangement is such that thermal coupling of the individual laser devices 20, 30 and 40 is possible via the substrate 10. This ensures that the individual laser devices have approximately the same temperature during operation, even when generating different colors or different brightnesses. The individual laser devices 20, 30 and 40 are designed to generate light of different colors.

For example, the laser device 20 is used to generate green laser light, the laser device 40 to generate blue laser light and the laser device 30 to generate red laser light. To control and monitor the individual laser devices, several contact elements are applied to the surface of the laser devices and connected to connections on the substrate 10 via bonding wires. Two contact elements 21 and 22 for the laser device 20 and two contact elements 41 and 42 for the laser device 40 are shown here as examples. They are used to supply the respective laser devices and lead as bonding wires to corresponding contact pads on the substrate 10 (not shown) or within the laser devices to the correspondingly doped areas.

Further contact pads 33 and 34 are also provided for the laser device 30, by means of which the voltage drop and thus the resistance across the active zone and the laser device can be determined by means of a 4-point measurement. In other words, the laser device can be supplied with a corresponding supply current and a supply voltage via the contact elements not provided with reference symbols here, and the voltage drop across the laser device is detected independently of this via the other contact pads 33 and 34. In addition to the sketchy 4-point measurement shown here, a normal 2-point measurement or another option for detecting the voltage drop via the laser device can also be used. An additional temperature sensor 50 is also provided, with the aid of which an average temperature and an average temperature change of the substrate 10 can be detected. As already described above, the sensor 50 is significantly slower than the fast voltage measurement in the laser device 30, so that it can only detect fast temperature fluctuations with a delay.

In addition, the arrangement according to at least one embodiment of the present disclosure includes a monitoring and control circuit 60, the corresponding outputs of which are connected to the respective supply terminals of the individual laser devices 20, 30 and 40. The monitoring and control circuit 60 is designed to apply corresponding supply signals in a PWM modulated manner to the respective laser devices 20, 30 and 40 and thus to generate the corresponding laser light in a pulsed manner.

For this purpose, the monitoring and control circuit 60 comprises a supply unit 64, which is connected to the respective laser devices. The supply unit 64 is used to detect and adjust a supply current and, if necessary, also the corresponding pulse length during pulsed operation of the laser devices. The supply unit 64 is connected to a processor unit 63, which in turn is coupled to a first memory 61 and a second memory 62.

In one operation of the arrangement according to at least one embodiment of the present disclosure, the individual laser devices generate light points on a display unit. A colored image is generated by superimposing the individual laser beams at this point on the display. In this way, white light can be formed from the three differently colored laser beams with a correspondingly equal and coordinated superimposition.

However, as mentioned at the beginning, the characteristic curve of the laser devices is strongly dependent on a corresponding temperature, so that the current through these laser devices or the corresponding voltage drop across the device also changes when the temperature changes. The individual laser devices do not behave in the same way, but show a different temperature behavior, which depends on the material of the laser device and other properties.

Figure 6:
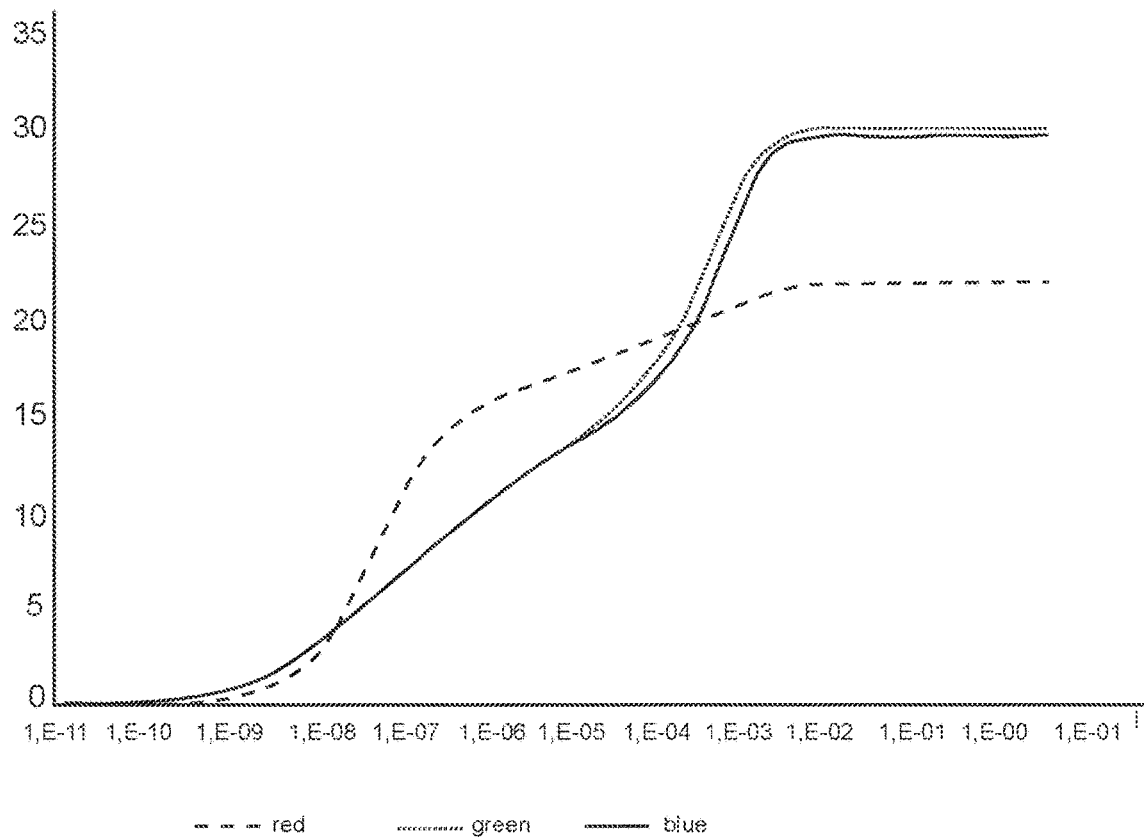
FIG. 6 shows the temperature change at different currents using different laser devices

FIG. 6 shows an example of the laser devices for generating the colors red, green and blue. The current through the laser devices is shown on the x-axis and a temperature change is shown on the corresponding y-axis. It can be seen very clearly that even small currents through the laser devices can cause a large temperature difference. Conversely, a corresponding temperature change in a laser device also causes a change in the current flowing through the laser device. FIG. 6 also shows that the individual temperature-dependent current curves for the devices are different. In particular, due to the different material system, the laser device for red laser light shows a significantly different dependence than the devices for green and blue laser light, at least up to the range of 10 A.$^{-2}$ This makes it relatively difficult to control the individual laser devices when generating white light, even if one assumes a uniform temperature or temperature change across all laser devices.

The disclosure now proposes to detect a change in temperature by means of a voltage drop across one or all laser devices and to use this measured voltage drop for setting future supply currents or supply voltages. This makes use of the strong dependence of the current-voltage characteristics on the respective temperature.

Figure 4:
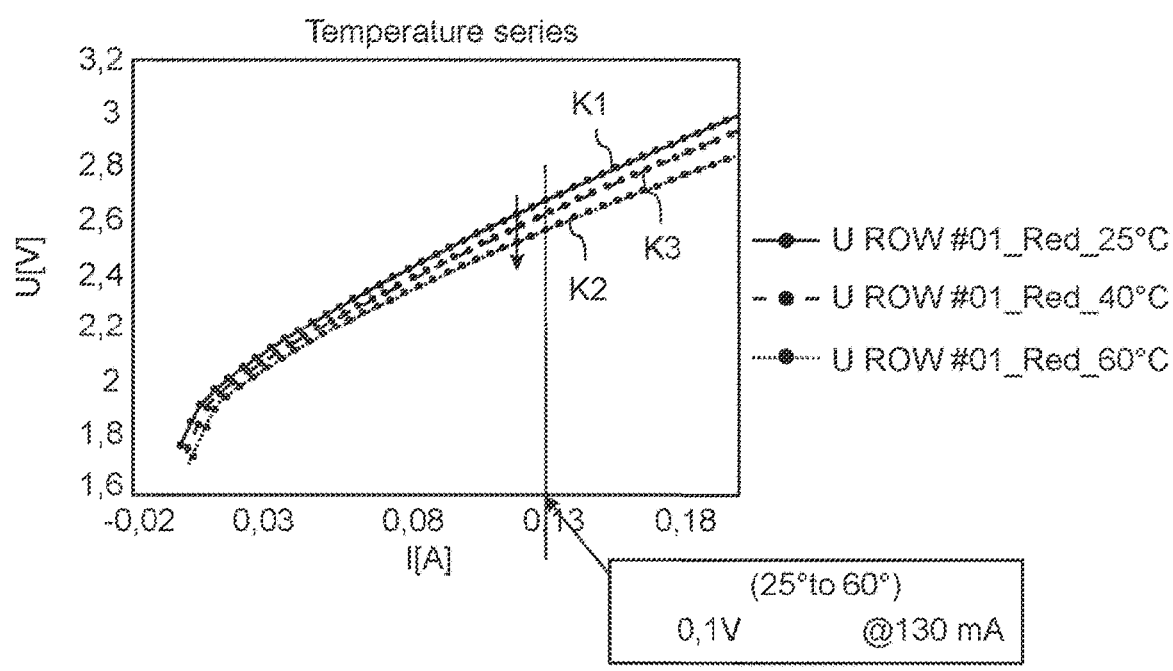
FIG. 4 shows a current-voltage characteristic for different temperatures of a laser device.

FIG. 4 shows such a dependence of the current-voltage characteristics for different temperatures for a laser device for red laser light. The x-axis again shows the current I flowing through the laser device, the y-axis shows the voltage dropping across the laser device. The three curves K1 to K3 show the respective course of the current-voltage characteristic at different temperatures of 25° for the upper curve K1, 40° for the middle curve K2 and 60° for the lower curve K3. At a constant current flow of 130 mA, which is quite common for laser devices, especially in the area of generating white laser light such as in data glasses applications or projection applications, a voltage drop of 100 mV results for a temperature difference of about 35° C.

Figure 5:
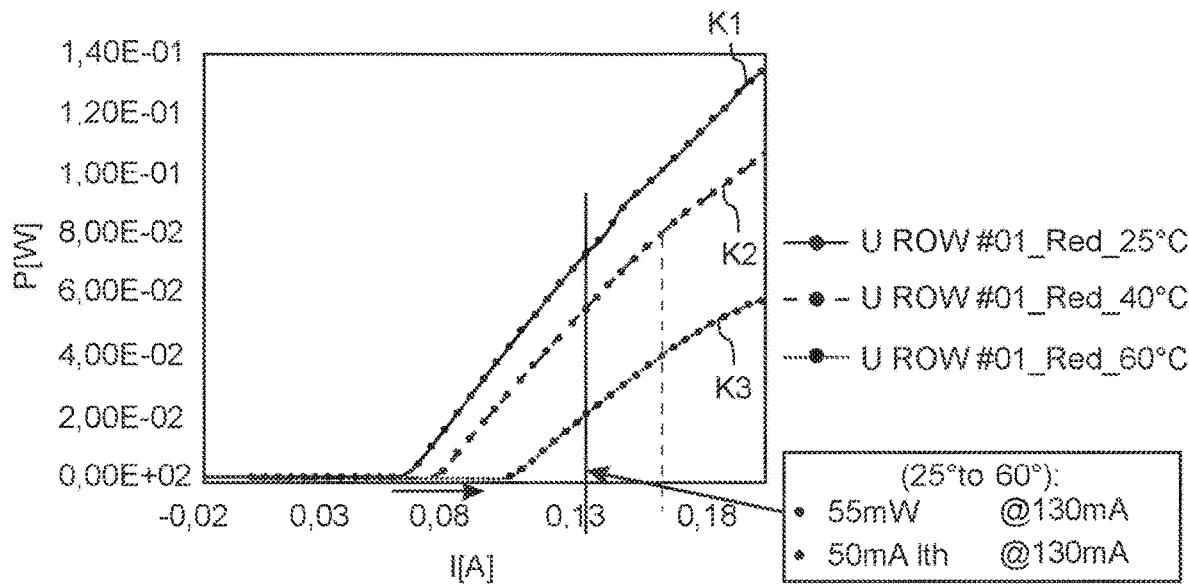
FIG. 5 shows a current/power characteristic curve for different temperatures of a laser device.

The voltage drop of 0.1 V at 130 mA shown here leads to a power loss over this temperature range in the region of a few 10 mW, which can be quite considerable in relation to the size of the respective laser device. FIG. 5 shows different power levels for the temperature curves shown above. At 130 mA, the difference in power is approximately 55 mW. At the same time, the application threshold for the supply current increases by around 50 mA. In practice, this results in a reduced current flow through the component at higher temperatures, so that the overall brightness decreases. Conversely, this means that a set current flow at higher temperatures leads to a lower brightness.

A different brightness due to different temperature differences leads to a change in the color location and thus to a different overall impression when different colored laser light is superimposed. To prevent this, it is useful not only to be able to identify the corresponding characteristic curve for the respective temperature, but also to have information about the future brightnesses or the color locations and brightnesses to be set in the future. For this purpose, memories 61 and 62 are provided in the proposed arrangement. Various support values are stored in memory 61 in the form of look-up tables that correspond to the respective characteristic curves. Memory 62 contains future brightness values for the respective laser devices 20, 30 and 40, for example the brightness and color values for the next points to be scanned in beam scanning.

During operation of the arrangement, the control circuit now detects a voltage drop across the laser device 30 at a set current and compares the current-voltage pair determined in this way with the various current-voltage pairs from the look-up table. It is assumed that the measured current-voltage pair follows a defined characteristic curve. A comparison of the measured current-voltage pair with the individual support values can be carried out in such a way that the pair with the lowest distance to the measured pair is identified. This determines the temperature-dependent characteristic curve in which the laser device is currently being operated. Due to the strong thermal coupling in the embodiment example of FIG. 1, the respective characteristic curve for the corresponding temperature of the two other laser devices can thus also be determined.

In the next step, the target brightness for a future light point is now taken from the second memory 62 and the target brightness is linked to a corresponding current-voltage value for the previously determined characteristic curve.

In one example, several interpolation points of the curves K1 to K3 as shown in FIG. 4 are located in a memory 61 of the device according to at least one embodiment of the present disclosure. In one operation of the arrangement, a voltage drop of approximately 2.65 V is detected via the red laser diode. At a current of 130 mA, this corresponds to the characteristic curve K2 in FIG. 4 and thus to a temperature of the laser device of approximately 40° C. A future light spot should now have a certain radiation power of 80 mW, for example. If we now follow the characteristic curve K2 in FIG. 5 up to a radiation power of 80 mW, this results in a current of approximately 155 mA. For the corresponding target brightness, it would therefore no longer be necessary to set 130 mA, but the slightly higher value of 155 mA due to the temperature.

As it can also be assumed that the temperature will also rise slightly with such an increased current, it is advisable to set an even higher current to compensate for these additional effects. Due to the thermal coupling between the individual laser devices, this method can be used for the target brightnesses for the other laser devices.

In the usual embodiments of such arrangements, the individual laser devices are operated in a pulse mode. The ratio of switch-on time to switch-off time determines the overall brightness, whereby an additional degree of freedom is gained by adjusting the current flow through the corresponding laser diode. The method now allows both the current through the laser device to be changed directly and the ratio between switch-on time and switch-off time to be adjusted to the desired target brightness.

Figure 2:
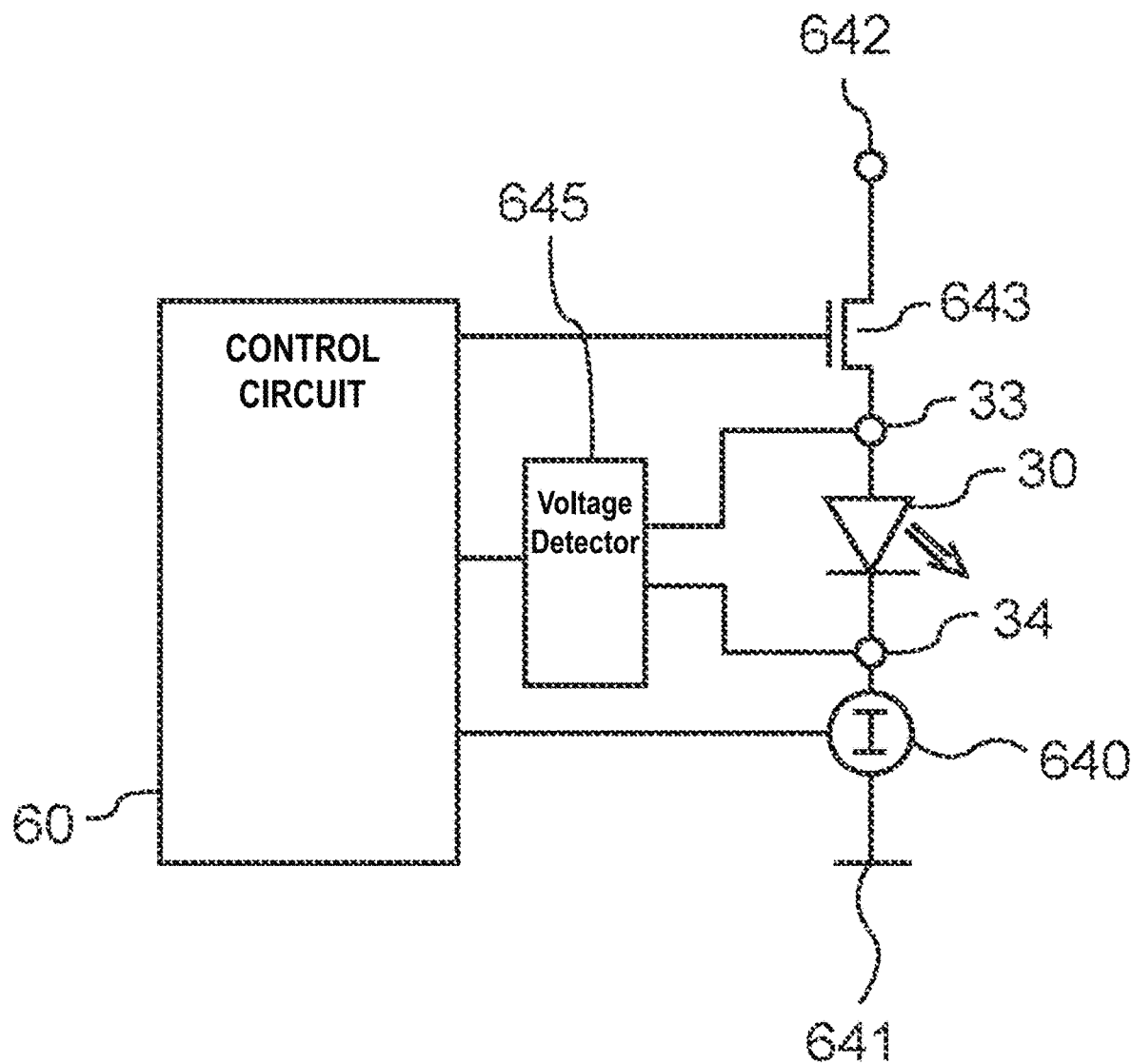
FIG. 2 shows a schematic representation of a circuit arrangement according to at least one aspect of the present disclosure.

FIG. 2 shows an embodiment example. In this example, the laser diode 30 is connected in a current path between a supply potential connection 642 and an earth potential connection 641. The supply potential connection 642 is coupled to the laser diode via a switch 643. The laser device is in turn connected to an adjustable current source 640 as shown. Both connections of the laser device 30 are connected via taps 33 and 34 to a voltage detector 645, the result of which is fed to the control circuit 60. Control circuit 60 is designed, on the one hand, to set the duty cycle, i.e. the ratio of switch-on time to switch-off time, via switch 643. In addition, the current flow through the adjustable current source can also be regulated by means of the control circuit 60.

In a second PWM-modulated mode, the laser device is usually only switched on for a few nanoseconds, but is operated with a high current pulse. Depending on the desired brightness, in some versions either the current flow is changed or an additional pulse is added or removed within the time period. For the generation of a further subsequent light spot, the voltage detector 654 now determines the voltage drop during operation of the laser device and passes this on to the control circuit 60. Control circuit 60 can now set the future current or the future pulse length either from a look-up table or by means of a function depending on a future target brightness and the detected temperature or the detected voltage drop.

The voltage drop across the laser diode can be determined in various ways. In one embodiment example, the voltage drop is detected while the laser device is operated in pulsed mode, in particular when switched on. However, in some applications it is common practice not to switch off the corresponding laser device completely when it is switched off, but to operate it with a lower current and in particular below the laser source. This means that the laser device 30 acts as a normal light-emitting diode with a significantly lower light intensity and a certain voltage drops across the laser device even in this operating state. Such a voltage drop is also part of a characteristic curve and can therefore be used to determine the temperature of the laser device. In a further alternative embodiment, it is common in some applications to switch the laser device briefly in the blocking direction after switching off in order to remove any charge carriers that may still be present. Even in this operating mode, the laser device has a measurable temperature-dependent characteristic that can be averaged via the respective voltage drop and can be used for further determination of future currents.

Figure 3:
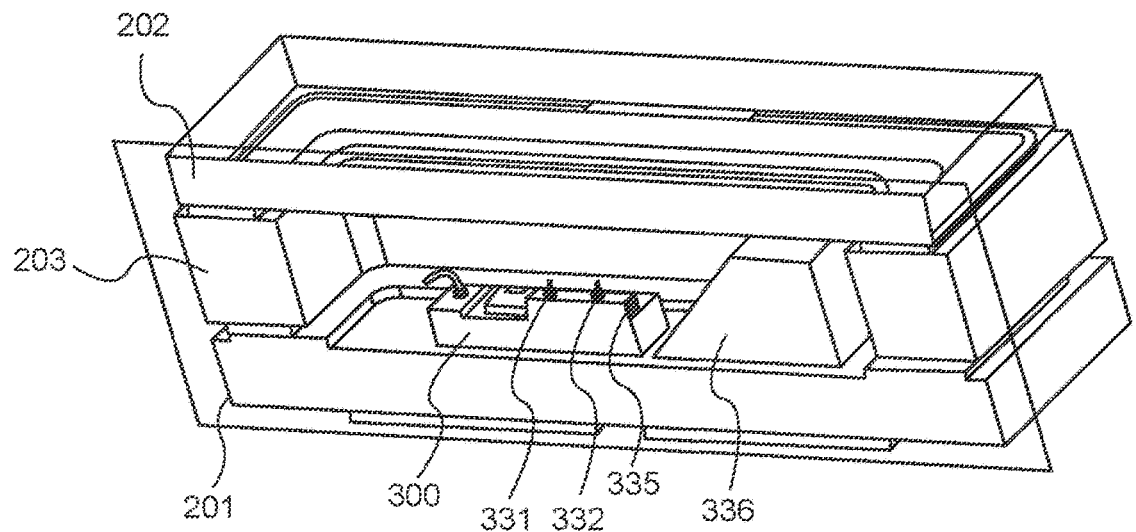
FIG. 3 shows a section through a laser device.

FIG. 3 shows a sectional view of an arrangement with a laser device, such as can be used for the proposed principle. The arrangement 200 is encapsulated in a housing, which has a substrate 201, a transparent cover 202 and a surrounding housing 203. The cover housing and substrate are firmly coupled to each other via respective adhesive or other layers, so that the laser device located within the arrangement is hermetically sealed. The laser device comprises a bar substrate 300 and a laser resonator with a laser facet 335 arranged thereon. Connection contacts 331 and 332 are contacted on the surface by means of bonding wires and the bonding wires are guided to the outside. The edge-emitting laser shown here uses its laser facet 335 to direct the laser light it generates onto an optical element 336, which deflects it and radiates it outwards through the transparent cover 202.

Due to the proportions shown here, the underside of the housing with the substrate 201 only heats up very slowly due to the significantly greater heat capacity, meaning that rapid temperature fluctuations can only be detected slowly by an externally mounted sensor. The sensor cannot react to rapid temperature changes. However, rapid temperature changes occur relatively frequently in a display device due to different target brightnesses for the individual pixels, so that externally mounted sensors are not suitable for adjusting the color location or compensating for a change in the characteristic curve. The method presented here therefore makes it possible to detect rapid temperature fluctuations due to the supply current via a change in the supply voltage and then to take this into account for a target brightness to be set.

Figure 7:
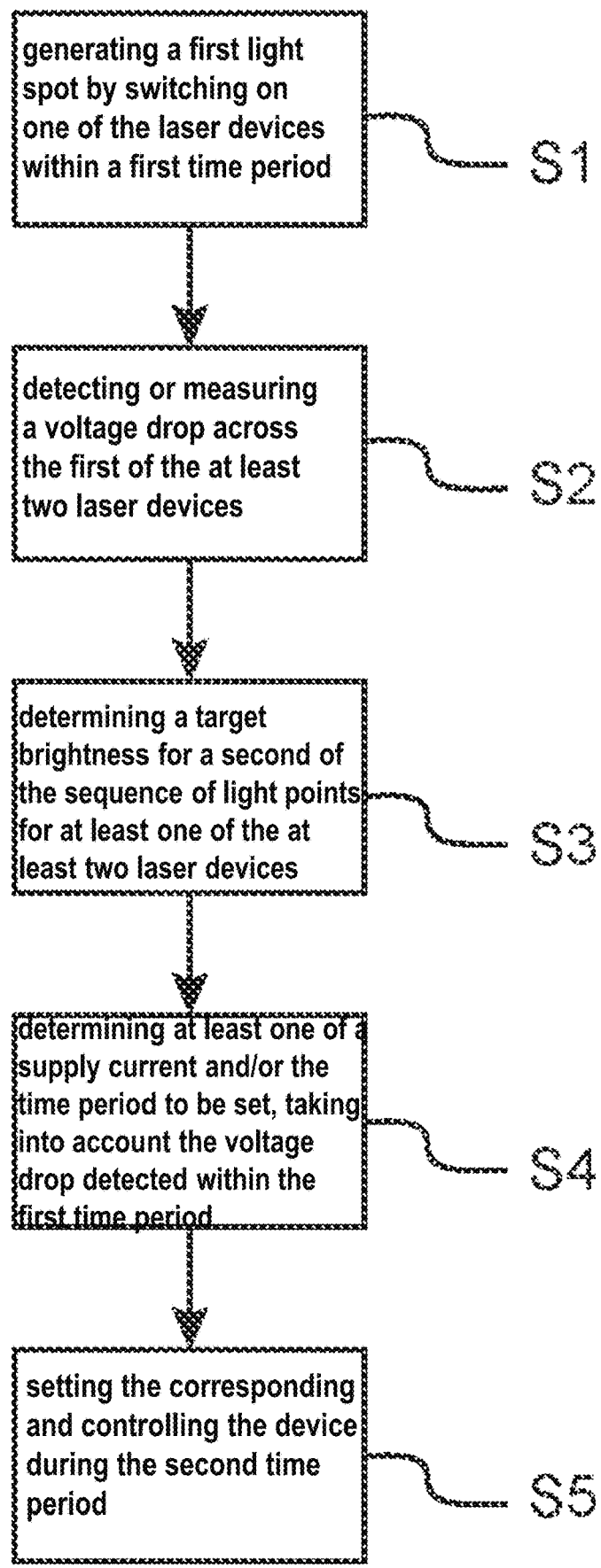
FIG. 7 shows an embodiment of a method for operating at least two laser devices according to according to at least one aspect of the present disclosure.

FIG. 7 shows a method for operating at least two laser devices, in particular for generating a display, in which the at least two laser devices generate a sequence of light spots, in particular of different brightness. In step S1, a first light spot is generated by switching on one of the laser devices within a first time period. This can be pulsed, but the laser device can also be switched on and off several times during this time period. In this respect, the first time period can also be divided into several subsections in step S1. The other laser devices can also be operated in this pulsed manner during this time period to generate a light spot. The respective brightness is set either by the current through the device or the duty cycle (switch-on to switch-off time) or a combination of both.

During this time period, a voltage drop across the first of the at least two laser devices is now detected or measured in step S2. The voltage drop corresponds to or is related to the temperature, whereby it can generally be said that the higher the temperature, the smaller the voltage drop for normal applications and temperatures. The voltage drop in step S2 can be determined in various ways.

This makes it easy to measure this during operation, either as a single value, as a sequence of individual values or even integrated. When the laser device is switched off, this results in a characteristic curve in the reverse direction. Sometimes this may be necessary if the active zone of the laser device is to be emptied. This also results in a voltage drop. It may also be possible to measure residual charge carriers after switching off, for example by integrative measurement of the current flowing in the reverse direction, which generates a voltage drop. Finally, a measurement in the switched-off state, i.e. not generating laser light, would also be possible if the laser device is still operated in the conductive state but below the laser threshold with very low intensity. Such a mode is sometimes useful because it greatly shortens the settling time for the device when the laser light is generated.

It is also possible to combine several measurements in step S2 or the results of measurements during different sections within the first time period. If necessary and if temperature changes do not occur so quickly, a measurement can also extend over a few time periods, for example the first and the two immediately following periods.

Then, in step S3, a target brightness is determined for a second of the sequence of light points for at least one of the at least two laser devices. This can follow the first light point, but there may also be other light points in between. The latter would be practical because it leaves more time to make the necessary settings and/or calculations.

Finally, in step S4, the supply current to be set and/or the time period to be set is determined, with or in which one of the at least two laser devices for generating the target brightness for the at least taking into account the voltage drop detected within the first time period. There are also several possibilities for this, including by means of a look-up table in which various support points from current and voltage value pairs are stored for different temperatures. in some cases, the characteristic curves can possibly also be approximated by a temperature-dependent function.

In step S5, the corresponding parameters are set and the device is controlled during the second time period.

REFERENCE LIST 1 display device
10 substrate
20, 40 laser device
21, 22 contact elements
41, 42 contact elements
30 laser device
33, 34 contact pads
50 temperature sensor
60 Control circuit
61, 62 memory
63 processor
64 supply unit
201 substrate
202 transparent lid
203 housing
300 bar substrate
331, 332 connections
335 laser facet
336 optical element
640 power source
641 ground potential connection
642 supply potential connection
643 switch
645 voltage detector
K1, K2 curves
K3 curve

The invention claimed is:

1. A method for operating at least two laser devices in which the at least two laser devices generate a sequence of light points, in particular of different brightness, comprising:
generating a first one of the sequence of light spots during a first period of time by a first one of the at least two laser devices;
detecting a voltage drop across the first of the at least two laser devices within the first time period; wherein the detecting is performed during a time period in which the first of the at least two laser devices is switched to a reverse direction;
determining a target brightness for a second of the sequence of light spots for at least one of the at least two laser devices;
determining at least one of a supply current and a switch-on time during a second time period for generating the target brightness for the at least one of the at least two laser devices, taking into account the voltage drop detected within the first time period; and
controlling the at least one of the at least two laser devices during the second time period with the determined supply current and/or the switch-on time,
wherein the at least two laser devices comprise laser diodes.

2. The method of claim 1, wherein detecting a voltage drop comprises at least one of the following:
measuring a voltage drop across the first of the at least two laser devices within or during a switch-on time;
measuring a voltage drop across the first of the at least two laser devices while the at least one of the at least two laser devices is operated below a laser threshold;
measuring a voltage drop across the first of the at least two laser devices during the period in which the at least one of the two laser devices rebounds from the last of the sequence of light spots to the first of the sequence of light spots.

3. The method according to claim 1, wherein the first time period is divided into a plurality of sub-time periods, and wherein the first of the at least two laser devices is operated in a pulsed manner during the sub-time periods.

4. The method according to claim 1, wherein the at least one of the at least two laser devices is a second laser device configured to generate a color different from the first laser device.

5. The method according to claim 1, in which at least three laser devices of different colors are provided, wherein the at least three laser devices are configured to be superimposed to form the color white.

6. The method according to claim 1, further comprising:
providing a plurality of temperature-dependent current and voltage value pairs, which form support values of a virtual temperature-dependent characteristic curve field.

7. The method according to claim 6, wherein determining at least one of a supply current and a turn-on time comprises:
determining a current and voltage value pair from the plurality of temperature-dependent current and voltage value pairs that is closest to the detected current and the detected voltage drop;
determining the supply current for generating the target brightness from the virtual characteristic curve formed by the determined pair of current and voltage values; or
determining a switch-on time from the virtual characteristic curve formed by the determined current and voltage value pairs to generate the target brightness.

8. The method according to claim 1, wherein determining at least one of a supply current and a turn-on time comprises:
calculating a supply current through the at least one of the at least two laser devices at a predetermined turn-on time; or
calculating a switch-on time of the at least one of the at least two laser devices at a predetermined current;
wherein the calculation is performed as a function of a temperature based on the detected voltage drop and a current flowing through the at least one laser device.

9. The method according to claim 1, wherein determining a target brightness for a second one of the sequence of light spots comprising:
determining an average brightness from the target brightness of the sequence of light points between the first and the second light point of the sequence of light points;
estimating an expected temperature at the target brightness, wherein the estimated expected temperature is used to determine at least one of a supply current and a turn-on time.

10. A display device, comprising:
a memory in which target color coordinates and/or a plurality of target brightness are stored for a plurality of illuminable pixels of the display device;
a first and at least one second laser device, which are designed while being supplied by a supply current to generate laser light for illuminating the pixels in a pulsed mode;
a detector circuit coupled to at least one of the first and at least one second laser device;
a supply circuit for providing an adjustable supply current to the first and at least one second laser device;
a control circuit which is coupled to the detector circuit and the supply circuit and is designed to supply a defined voltage in the reverse direction to the laser device coupled to the detector device during a first time period and to detect a voltage drop across the coupled laser device by means of the detector circuit and to set the supply current for at least one of the first and at least one second laser device during a second time period based on the color location and/or the target brightness for an image point to be illuminated and the detected voltage drop
wherein the first and at least one second laser device comprise laser diodes.

11. The display device according to claim 10, wherein the control circuit is adapted to adjust the supply current, comprising the control circuit, during the second time period, adjusting a magnitude of the supply current and/or the duration with which the at least one laser device is operated.

12. The display device according to claim 10, wherein the control circuit is configured, via the detector circuit:
to detect a voltage drop across the first of the at least two laser devices within or during a turn-on time within the first time period;
to detect a voltage drop while the at least one of the at least two laser devices is operated below a laser threshold; and
to detect a voltage drop during the period in which the at least one of the two laser devices jumps back from the last of the sequence of light spots to the first of the sequence of light spots.

13. The display device according to claim 10, wherein the first and at least one second laser device are configured to generate light of different colors.

14. The display device according to claim 10, wherein at least three laser devices are provided for generating different colors, which are configured to be superimposed to form the color white.

15. The display device according to claim 10, further comprising a plurality of temperature-dependent current and voltage value pairs, which form support values of a virtual temperature-dependent characteristic curve field and which are stored in a memory.

16. The display device according to claim 15, wherein the control circuit is adapted to determine a current and voltage value pair from the plurality of temperature-dependent current and voltage value pairs that is closest to the detected current drop and the detected voltage drop; and
to determine the supply current for generating the target brightness from a virtual characteristic curve associated with the determined current and voltage value pair; and/or
to determine a switch-on time from the virtual characteristic curve formed by the determined current and voltage value pairs to generate the target brightness.

17. The display device according to claim 10,
wherein the control circuit is adapted for calculating the supply current through the at least one of the at least two laser devices at a predetermined turn-on time during the second time period; or
adapted for calculating a switch-on time of the at least one of the at least two laser devices at a predetermined supply current;
wherein the calculation is performed as a function of a temperature based on the detected voltage drop and a current flowing through the at least one laser device during the first time period.

* * * * *